United States Patent [19]
Hollmer et al.

[11] Patent Number: 6,009,014
[45] Date of Patent: Dec. 28, 1999

[54] ERASE VERIFY SCHEME FOR NAND FLASH

[75] Inventors: Shane C. Hollmer, San Jose, Calif.; Chung-You Hu, Austin, Tex.; Binh Q. Le, Mountain View; Pau-ling Chen, Saratoga, both of Calif.; Jonathan Su, Evanston, Ill.; Ravi Gutala, Milpitas; Colin Bill, Cupertino, both of Calif.

[73] Assignee: Advanced Micro Devices, Inc., Sunnyvale, Calif.

[21] Appl. No.: 09/090,296

[22] Filed: Jun. 3, 1998

[51] Int. Cl.[6] .................................................. G11C 16/06
[52] U.S. Cl. .............................. 365/185.22; 365/185.29; 365/218; 365/185.26; 365/185.33
[58] Field of Search ..................... 365/185.01, 185.22, 365/185.29, 218, 185.26, 185.33

[56] References Cited

U.S. PATENT DOCUMENTS

| | | | |
|---|---|---|---|
| 5,473,563 | 12/1995 | Suh et al. ............................ | 365/185.13 |
| 5,671,178 | 9/1997 | Park et al. .......................... | 365/185.22 |
| 5,696,717 | 12/1997 | Koh ..................................... | 365/185.22 |
| 5,726,934 | 3/1998 | Tran et al. ............................. | 365/185.2 |
| 5,748,538 | 5/1998 | Lee et al. .............................. | 365/185.06 |
| 5,862,074 | 1/1999 | Park ..................................... | 365/185.03 |

*Primary Examiner*—Viet Q. Nguyen
*Attorney, Agent, or Firm*—Skjerven, Morrill, MacPherson, Franklin, and Friel LLP.

[57] ABSTRACT

The present invention provides a method of verifying that all flash EEPROM transistors in a NAND string are properly erased without overerasing by applying a bias voltage to the source of the bottom select gate of the NAND array and applying a non-negative erase verify voltage to the control gates of each transistor during an erase verify. The bias voltage is at least equal to the erased threshold voltage of the worst case transistor to ensure proper erase verification. If all transistors are not erased, then another erase operation is performed. Erasing is repeated until the erase verify operation indicates that all transistors are properly erased. By erasing and verifying according to the present invention, the NAND array is completely and properly erased while minimizing overerasing the array.

15 Claims, 4 Drawing Sheets

ERASE VERIFY SCHEME FOR NAND FLASH

BACKGROUND

1. Field of Invention

The present invention relates to non-volatile semiconductor memory arrays, and more particularly to NAND EEPROM arrays biased during erase verify to reduce over-erase and improve reliability.

2. Related Art

Non-volatile semiconductor memories, such as flash EEPROMs, are well known in the art. Flash EEPROMs typically are transistors comprising source and drain diffusion regions of a first conductivity type (e.g., n-type) formed within a semiconductor substrate of a second conductivity type (e.g., p-type), a polysilicon floating gate overlying a channel region between the source and drain regions, a first insulative layer separating the floating gate from the channel, a polysilicon control gate overlying the floating gate, and a second insulative layer separating the control gate from the floating gate. The flash EEPROM can be programmed, read, or erased by applying different voltages to the transistor.

The EEPROM can be programmed by biasing the control gate to a higher voltage than the substrate. As a result, electrons are accelerated from the substrate across a channel formed between the substrate and floating gate and "tunnel" to the floating gate by Fowler-Nordheim tunneling. The floating gate accumulates and traps the electrons to raise the threshold voltage $V_t$ of the EEPROM. Once programmed, the EEPROM retains the raised threshold voltage.

The EEPROM can be read by applying a read voltage to the control gate of the EEPROM, typically via a word-line, and by applying positive bias to the drain, typically via a bit-line. The read voltage is a voltage below the $V_t$ of a programmed transistor and above the $V_t$ of an erased or unprogrammed transistor. Thus, if the EEPROM is programmed, the transistor will be "off" and not conduct drain current, and if the EEPROM is erased or unprogrammed, the transistor will be "on" and conduct drain current. By sensing this drain current, the EEPROM can be read as storing a "1" or a "0".

The EEPROM can be erased by biasing the substrate to a higher positive voltage than the control gate (e.g., by applying 18 V to the substrate and grounding the control gate) to force the electrons from the floating gate. As a result, the threshold voltage is lowered to a set erased threshold voltage, such as between −1.0 V and −1.5 V.

A well-known non-volatile memory array using this type of flash EEPROM is a NAND array 10 having columns and rows of NAND strings 11, as shown in FIG. 1. Each NAND string 11 consists of N EEPROM transistors 12-1 to 12-N (as described above), where N is typically equal to 8 or 16. Each EEPROM transistor 12, which stores one bit value, is connected serially to other transistors 12 at common drain/source regions, and the string of transistors 12 is connected between a string-select transistor 13 and a ground-select transistor 14. The drain of string-select transistor 13 is connected to a bit-line, and the source is connected to the drain of the first EEPROM transistor 12-1. The drain of ground-select transistor 14 is connected to the source of the last EEPROM transistor 12-N, and the source is connected to an array ground.

A particular transistor, such as transistor 12-2, of NAND string 11 is typically programmed, for example, by applying a program voltage (i.e., 18 V) to the control gate of the selected transistor 12-2, a pass voltage (i.e., 7–10 V) to the control gates of unselected transistors 12, a logic "0" (i.e., 0–0.3 V) to the bit line, a supply voltage $V_{cc}$ (i.e., 3.3 V) to the gate of string-select transistor 13, and 0 V to the gate of ground-select transistor 14. As a result, string-select transistor 13 is turned on, unselected transistors 12 are turned on to act as pass transistors regardless of their programmed state, and ground-select transistor is turned off. The large voltage difference between the control gate and substrate of selected transistor 12-2 causes Fowler-Nordheim tunneling to raise the threshold voltage of transistor 12-2, thereby programming the desired transistor.

A particular transistor, such as transistor 12-2, is read by applying, for example, a read voltage (i.e., 0 V if the $V_t$ of the erased transistors are negative and the $V_t$ of programmed transistors are positive) and a pass voltage (i.e., 4.5 V) to the control gates of the unselected transistors 12 and string-select and ground-select transistors 13 and 14. As a result, the unselected transistors 12 are turned on and act as pass transistors. A circuit senses if current flows through transistor 12-2, i.e., if transistor 12-2 is turned on, to determine whether a "0" or a "1" is stored.

Transistors 12 of NAND string 11 can be simultaneously erased by applying, for example, a large erase voltage (i.e., 20 V) to the substrate of each transistor 12 and 0 volts to the gate of transistors 12 while floating the gates of select transistors 13 and 14. Due to the large voltage drop, electrons are removed from the floating gates of each transistor 12, thereby shifting the voltage threshold of each transistor negative to erase the transistors.

However, the EEPROM transistors are usually not identical due, in part, to non-uniform process parameters during the fabrication of the transistors. Consequently, even though the same potential is applied during the same erasing operation, the threshold voltages for the transistors may vary, which can result in a range of threshold voltages both below and above the desired erased $V_t$. When transistors are not properly erased, reading errors may result. For example, an improperly erased transistor having a $V_t$ higher than the read voltage may be mistakenly read as a programmed, rather than an erased, memory cell. During reading, a margin is necessary to minimize effects of read disturb, temperature variations, charge gain, and other adverse effects.

To ensure all transistors are properly erased, a very large or long erase voltage is typically applied to all the transistors. The erase voltage is chosen to be greater than the erase voltage required to erase the worst-case transistor, i.e., the oldest, slowest speed, or highest threshold voltage transistor. Thus, by overerasing the transistors, all transistors are ensured to be erased.

However, problems arise with this type of method. First, by overerasing all the time, fresh memory cells are unnecessarily and repeatedly overdepleted and programmed, thereby reducing the reliability of these cells and increasing these cells' programming times during their lifetime. Second, as the memory cells age, some cells may be increasingly slow to erase so that even with a margin for the erase voltage, some cells may not be guaranteed to properly erase.

Accordingly, a method of ensuring that all the transistors in a NAND string are properly erased is desired that overcomes the deficiencies discussed above with conventional methods.

SUMMARY

The present invention provides a method to minimize overerasing a flash EEPROM NAND array by verifying if all memory transistors are properly erased after each erase operation. If not all are properly erased, another erase operation is performed. These erase and erase verify steps are repeated until all memory transistors have been verified as properly erased. By erasing and verifying according to the present invention, the NAND array is completely and properly erased without overerasing the array.

After an erase operation is performed on a typical NAND string, an erase verify operation is performed by turning on the string-select and ground-select transistors, applying a non-negative erase verify voltage to each control gate of memory transistors between two select transistors, applying a bias voltage to the source of the ground-select transistor, and determining if any current flows through the NAND string. The erase verify voltage minus the bias voltage, which is the voltage drop across the gate and source ($V_{gs}$), should be slightly greater than the erased threshold voltage of the worst case transistor to ensure proper erase verification.

A particular transistor will turn on and current will flow through the transistor if $V_{gs}$ is greater than or equal to the transistor's threshold voltage $V_t$. However, to sink the entire current from the drain to the source, $V_{gs}$ should be slightly greater than $V_t$ (by the amount of overdrive required). Thus, if all the transistors in the NAND string have threshold voltages slightly less than $V_{gs}$, then all the transistors will turn on and the entire current will flow through the NAND string, indicating that all the transistors have been properly erased, i.e., all have a $V_t$ less than or equal to a desired erased threshold voltage.

However, if one or more transistors have thresholds greater than $V_{gs}$, those transistors will remain off and not conduct current, thereby preventing current from flowing through the string and indicating that all the transistors have not been properly erased, i.e., some have a $V_t$ greater than the desired erased threshold voltage. Thus, if the entire current is not detected during an erase verify, erase and erase verify operations are repeated until the entire current is detected to indicate all transistors have been properly erased. By setting $V_{gs}$ slightly greater than the desired erased threshold voltage of the transistors during erase verify, the entire current will be detected only when all transistors have thresholds at or below the desired $V_t$.

Therefore, having a method to determine when the worst-case transistor is just erased, incremental erasing operations can be performed to minimize overerase, while still ensuring that all transistors have been properly erased.

In one embodiment of the present invention, the desired $V_t$ for erased transistors in a NAND array is slightly negative, for example −1.0 V. Grounding the control gates of each transistor, while applying a bias voltage of 0.7 V to the source of the ground-select transistor of the NAND string during erase verify, results in a $V_{gs}$ of −0.7 V. Assuming the transistor needs 300 mV of overdrive to sink 3 μA of current, the entire 3 μA will only flow through the NAND string if all transistors within the string have threshold voltages less than or equal to −1.0 V. Therefore, detecting 3 μA of current during erase verify indicates that all transistors are properly erased, i.e., having threshold voltages no greater than the desired threshold of −1.0 V.

The present invention will be more fully understood in light of the following detailed description taken together with the accompanying drawings.

BRIEF DESCRIPTION OF DRAWINGS

Note that use of the same reference numbers in different figures indicates the same or like elements.

DETAILED DESCRIPTION

The present invention provides a method of verifying that all flash EEPROM transistors in a NAND string are properly erased by applying a bias voltage to the source of the bottom select gate of the NAND array and applying a non-negative erase verify voltage to the control gates of each transistor during an erase verify. Erase and erase verify operations are then performed until all the transistors have been verified as properly erased, i.e., with threshold voltages less than or equal to the desired threshold voltage. By erasing and verifying according to the present invention, the NAND array is completely and properly erased without overerasing the array.

Figure 1:
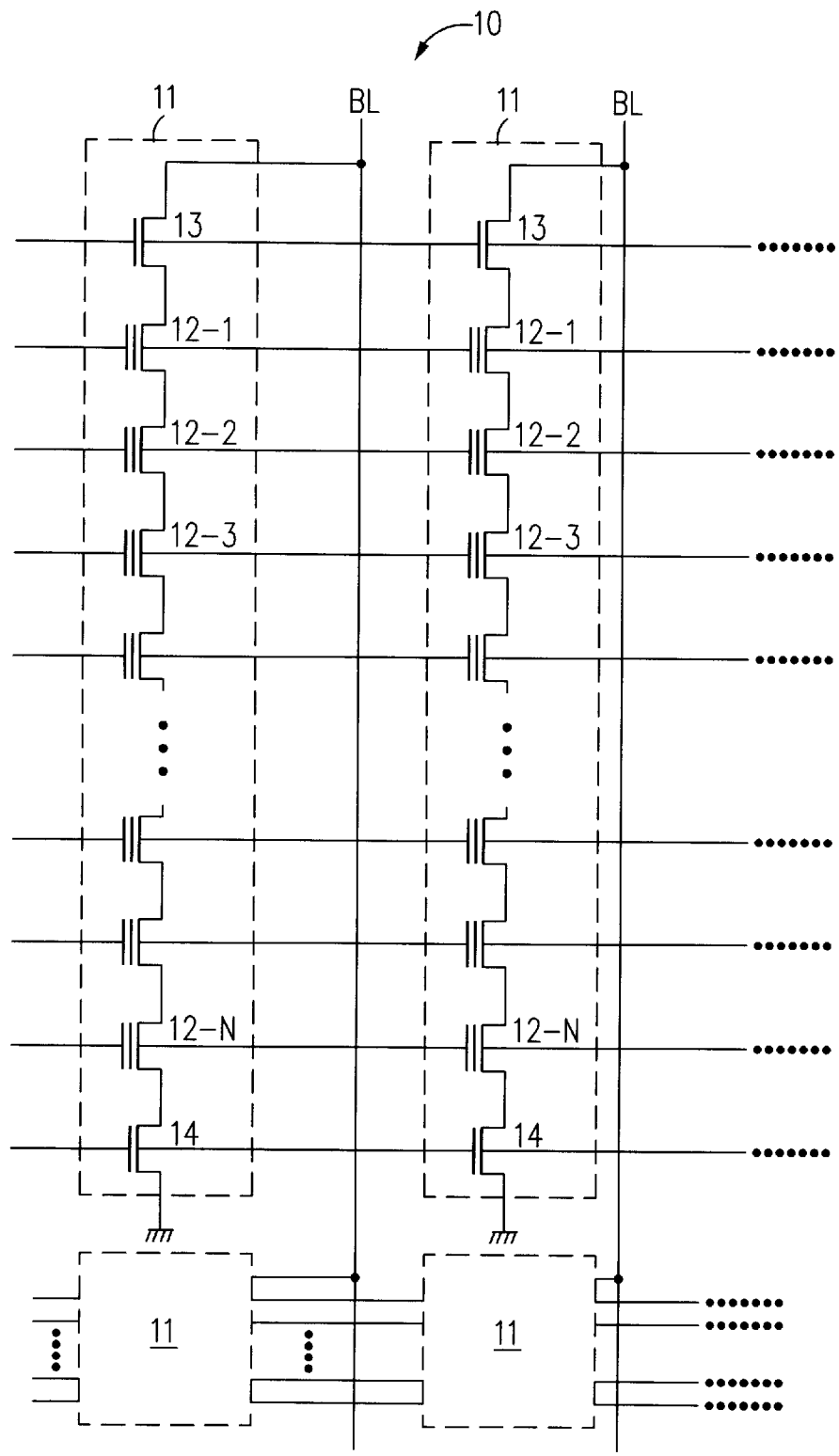
FIG. 1 is a circuit diagram of a conventional NAND array.
Figure 2:
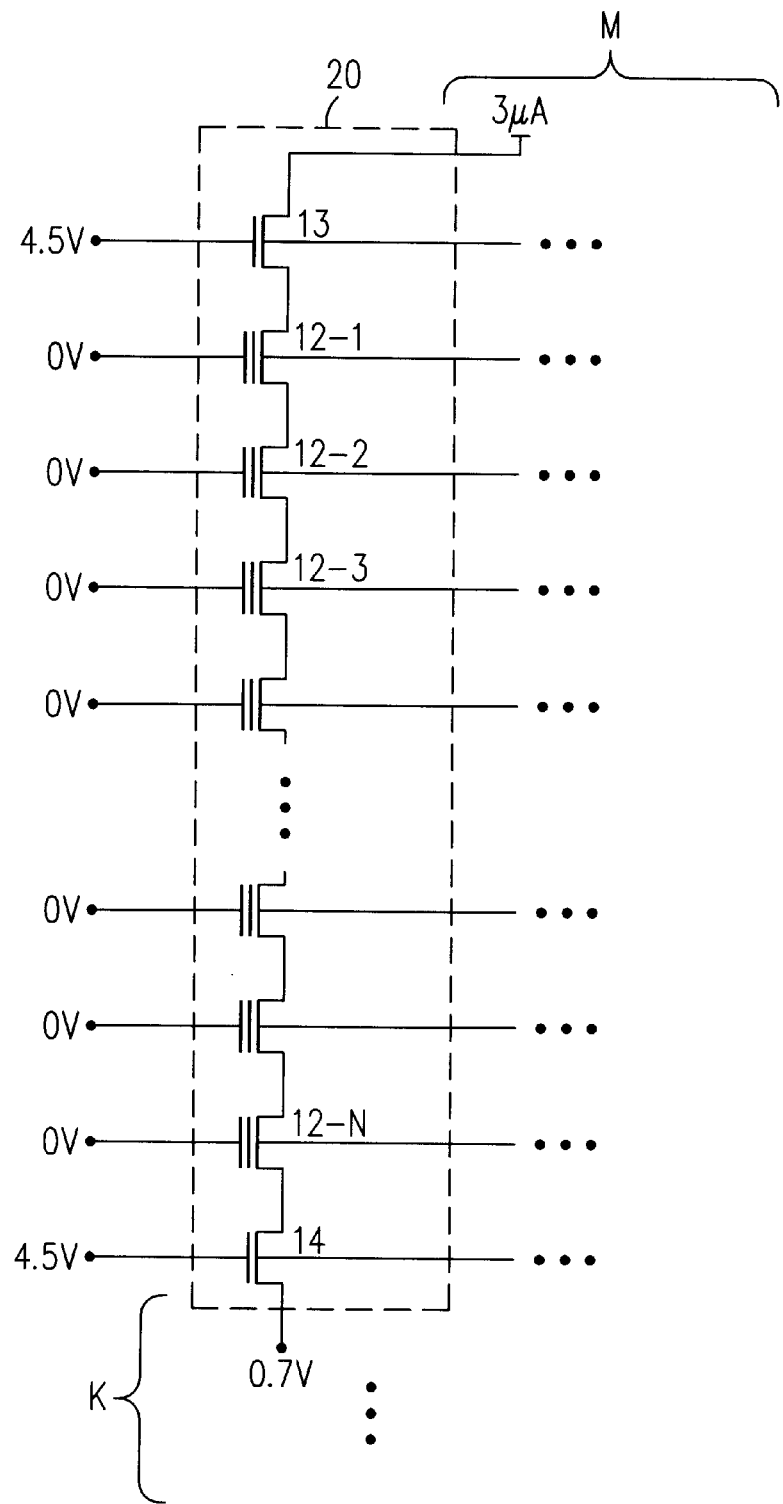
FIG. 2 is a circuit diagram of a conventional NAND string, biased for an erase verify operation according to the present invention.

FIG. 2 is a circuit illustration of a conventional NAND string 20, biased during an erase verify operation according to the present invention. A NAND array is formed of M columns and K rows of NAND string 20. NAND string 20 has N EEPROM transistors 12 connected serially at common source/drain regions so that each NAND string 20 has N bits, with each bit stored in an EEPROM transistor 12. After performing an erase operation to remove electrons from the floating gate of each EEPROM transistor 12, the erase verify operation is performed to determine if each transistor has been properly erased.

After an erase operation is performed on NAND string 20, an erase verify operation is performed by turning on string-select transistor 13 and ground-select transistor 14 (e.g., by applying 4.5 V or a supply voltage to each select gate), applying a non-negative erase verify voltage (e.g., 0 V) to each control gate of transistors 12, applying a bias voltage (e.g., 0.7 V) to the source of ground-select transistor 14, and providing a sensing current (e.g., 3 μA) to each of the bit-lines. As a result, the gate-to-source voltage, $V_{gs}$, of each transistor 12 equals the erase verify voltage minus the bias voltage and will turn on or conduct current only if the threshold voltage $V_t$ of the transistor is less than or equal to $V_{gs}$. The erase verify voltage and bias voltage should be such that $V_{gs}$ is at least equal to the desired threshold voltage of the worst case transistor to ensure proper erase verification. Determining if any current flows through the NAND string indicates whether or not all transistors 12 have been properly erased, i.e., each having threshold voltages no greater than the desired threshold voltage.

A particular transistor will turn on if the voltage drop across the transistor's gate and source ($V_{gs}$) greater than or equal to its threshold voltage. However, there exists a certain amount of overdrive needed to fully conduct a current through the transistor. Thus, if all the transistors 12 in NAND string 20 have threshold voltages slightly less than $V_{gs}$, then all the transistors 12 will turn on and the entire current will flow through NAND string 20, indicating that all transistors 12 have been properly erased, i.e., all have a $V_t$ less than or equal to a desired threshold voltage.

However, if one or more transistors 12 have threshold voltages greater than $V_{gs}$ by the amount of overdrive, those transistors will remain off and/or not sink the entire current, thereby preventing the entire current from flowing through NAND string 20 and indicating that all the transistors 12 have not been properly erased, i.e., some have a $V_t$ greater than the desired threshold voltage. Thus, if the entire current is not detected during an erase verify, erase and erase verify operations are repeated until the entire current is detected to indicate all transistors 12 have been properly erased. By setting $V_{gs}$ less than the desired erased threshold voltage of the transistors (by the amount of overdrive) during erase verify, the entire current will be detected only when all transistors have thresholds at or below the desired $V_t$.

In one embodiment, shown in FIG. 2, the desired erase threshold voltage is −1.0 V, and 300 mV of overdrive allows transistors 12 to sink 3 µA of sense current. The erase verify voltage is approximately 0 volts, and the bias voltage applied to the source is 0.7 volts, resulting in a $V_{gs}$ of −0.7 volts. Thus, during erase verify, the NAND string will conduct the entire 3 µA of current if each of the transistors has threshold voltages less than or equal to −1.0 volts.

Figure 3:
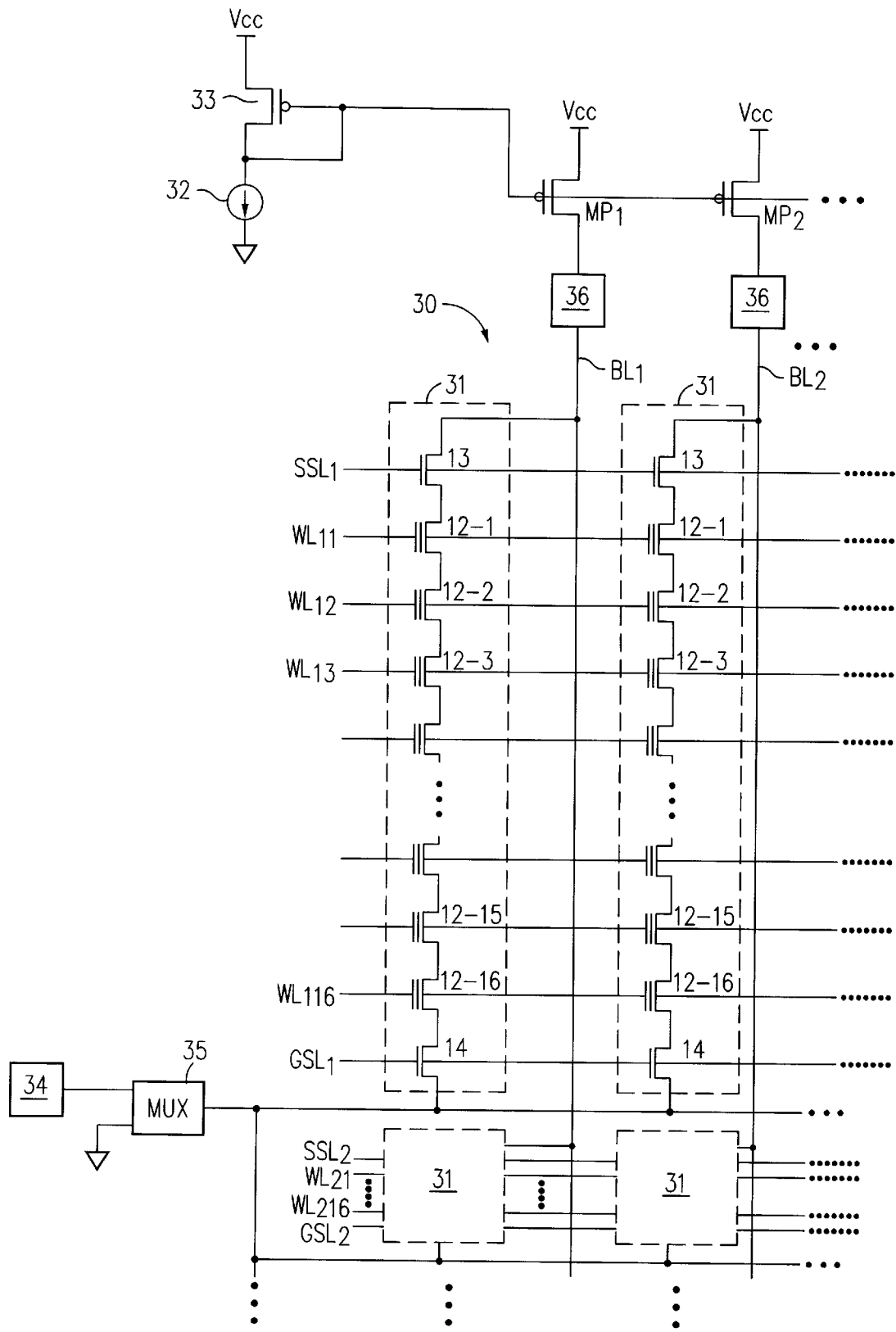
FIG. 3 is one embodiment of a circuit diagram of a large NAND array, biased for an erase verify operation according to the present invention.

FIG. 3 shows one embodiment of how an erase verify can be implemented for a large NAND array 30. NAND array 30 array has 4000 columns or bit-lines $BL_1$ to $BL_M$ and 1000 rows of 16-bit NAND strings 31, although any number of columns and rows are possible. A bit-line is connected to the drain of each string-select transistor 13 in a column of NAND strings 31. The select gate of each row of string-select transistors 13 is commonly connected to a string-select line $SSL_1$ to $SSL_K$, and the select gate of each row of ground-select transistors 14 is commonly connected to a ground-select line $GSL_1$ to $GSL_K$, where K=1000. The control gate of each row of EEPROM transistors 12 is commonly connected to a word-line $WL_{1,1}$ to $WL_{K,N}$, where K=1000 is the number of NAND strings 31 and N=16 is the number of EEPROM transistors 12 per NAND string 31.

To verify that all transistors 12 in NAND array 30 are properly erased, an erase verify operation is simultaneously performed on each of the 4000 columns of NAND strings 31. To generate a 3 µA sensing current to each bit-line $BL_1$ to $BL_{4000}$, a conventional current mirror can be used to mirror a 3 µA reference current to each bit-line. For example, a current source 32 generating 3 µA is coupled between ground and the drain of a PMOS transistor 33, the source is connected to a source voltage $V_{cc}$, and the gate is commonly connected to the drain. Each of PMOS transistors $MP_1$ to $MP_{4000}$ provides the mirrored 3 µA current to an associated bit-line $BL_1$ to $BL_{4000}$. Each of PMOS transistors $MP_1$ to $MP_{4000}$ has a source connected to $V_{cc}$, a gate commonly connected to the gate of PMOS transistor 33, and a drain connected to each bit-line $BL_1$ to $BL_{4000}$ to supply a mirrored 3 µA current to each bit-line.

Figure 4A:
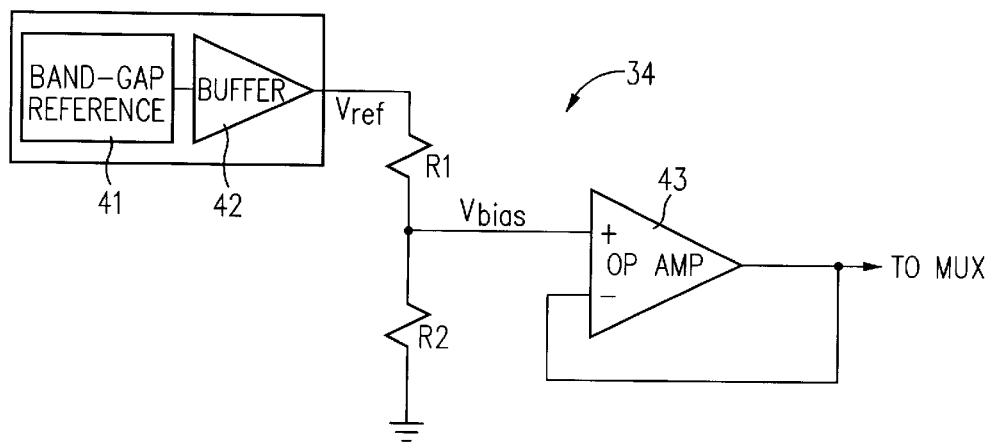
FIGS. 4A and 4B are more detailed diagrams of the array biasing circuit and page buffer, respectively, of FIG. 3.

An array biasing circuit 34, shown in detail in FIG. 4A, provides the same desired bias voltage to the source of each ground-select transistor 14 in each NAND string 31. Array biasing circuit 34 includes a band-gap reference 41 connected to a buffer 42 for generating a high precision reference voltage $V_{ref}$. $V_{ref}$ is then used as an input to a voltage divider circuit having two resistors R1 and R2. The desired bias voltage $V_{bias}$ is taken at a node between resistors R1 and R2, where the value of the desired voltage $V_{bias}$ can be adjusted by changing the values of resistors R1 and R2 accordingly. The voltage from the divider circuit is fed into the positive input of a unity gain feedback op-amp 43 to provide a desired bias voltage to NAND array 30. A unity gain feedback op-amp 43 is desired to maintain a precise bias voltage even when a large current is flowing into biasing circuit 34. For example, when NAND array 30 has been properly erased, each of the 4000 bit-lines will conduct the full 3 µA of current during erase verify, resulting in 12 mA of current flowing into an array biasing circuit 34.

The output of op-amp 43, representing the desired bias voltage, is connected to one input of a multiplexer 35, and ground is connected to another input of multiplexer 35. Multiplexer 35 is coupled between biasing circuit 34 and NAND array 30 to select whether a bias voltage or ground is applied to the source of each ground select transistor 14. For example, a bias voltage is selected during erase verify operations, while ground is selected during read operations.

Figure 4B:
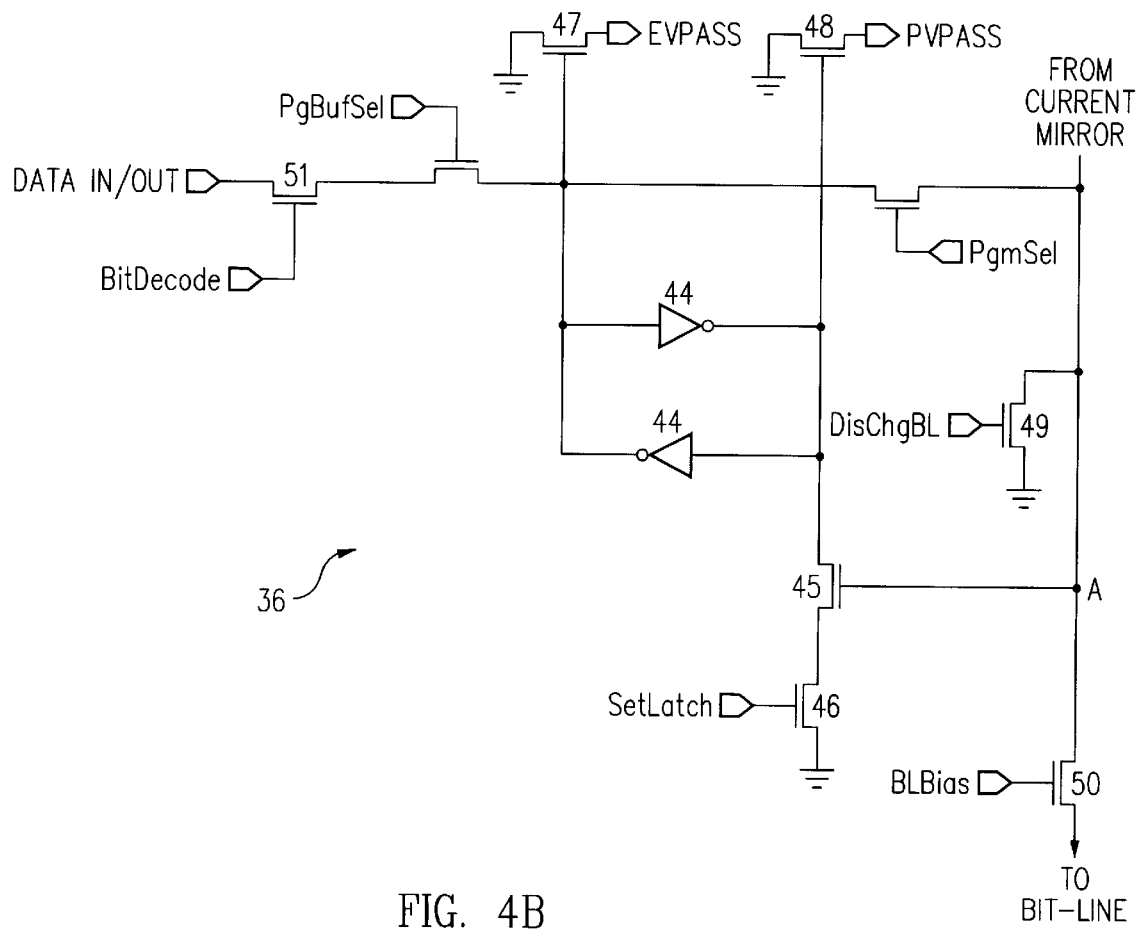

During an erase verify, all the transistors in a bit-line $BL_K$ are verified as properly erased when the entire sensing current flows through the bit-line $BL_K$, indicating that all the transistors are turned on and pulling through all the sensing current. A page buffer 36, shown in detail in FIG. 4B, is connected to each bit-line to detect whether the full 3 µA is flowing through the bit-line. Page buffer 36 includes, for example, a latch consisting of two cross-coupled inverters 44 connected to the bit-line at node A via an NMOS transistor 45. Before an erase operation, the latch is set to a known state. After the erase operation, an erase verify operation according to the present invention is performed. If all the transistors in the bit-line are properly erased, all the transistors will turn on and pull through the full 3 µA sensing current, thereby pulling the voltage at node A low and turning off NMOS transistor 45. Therefore, if a pulse is applied to the gate of an NMOS transistor 46, connected between NMOS transistor 45 and ground, the latch is maintained in its original known state because NMOS transistor 45 has been turned off.

However, if one or more transistors in the bit-line have not been properly erased, not all the transistors will turn on and the full 3 µA of current will not conduct through the bit-line. Node A will then be pulled high, i.e. to $V_{cc}$, which turns on NMOS transistor 45. As a result, applying a pulse to NMOS transistor 46 will reset the latch because NMOS transistor 45 is on. The state of the latch can be checked by monitoring the voltages at NMOS transistors 47 and 48 connected to the latch. Thus, applying a pulse and determining whether the latch has been reset after each erase verify operation indicates whether all the transistors in the bit-line have been properly erased. To check if NAND array 30 has been properly erased, the state of the latch in each page buffer is simultaneously monitored after an erase verify. If any one of the 4000 latches has been reset, another erase operation is performed, followed by an erase verify. This process is repeated until all the latches maintain their initial state after an erase verify operation.

Sensing circuit 36 can also include additional NMOS transistors 49, 50, 51 to provide features such as discharging the bit-line, providing bit-line biasing, and shifting data out from the latches, respectively.

Thus, with the implementation shown in FIGS. 3, 4A, and 4B, an erase verify according to the present invention can be performed on a very large NAND array. Accordingly, over-erasing memory cells in large NAND arrays is minimized, thereby improving device reliability.

The above-described embodiments of the present invention are merely meant to be illustrative and not limiting. It will thus be obvious to those skilled in the art that various changes and modifications may be made without departing from this invention in its broader aspects. For example, the implementation and biasing in FIGS. 2, 3, 4A, and 4B are used to illustrate one way of implementing and biasing the erase verify operation of the present invention for very large NAND arrays with a specific desired threshold. Other methods of implementing and biasing the erase verify scheme for use with specific NAND array devices will be obvious to those skilled in the art. Therefore, the appended claims encompass all such changes and modifications as fall within the true spirit and scope of this invention.

We claim:

1. A method of erase verifying for a NAND string, said string comprising a plurality of floating gate transistors coupled between a string-select transistor and a ground-select transistor, said method comprising:

applying a first voltage to the select gate of the string-select transistor;

applying a second voltage to the select gate of the ground-select transistor;

applying a sensing current to the drain of the string-select transistor;

applying a non-negative erase verify voltage to the control gate of the floating gate transistors;

applying a bias voltage to the source of the ground-select transistor; and detecting whether the sensing current flows through the NAND string.

2. The method of claim 1, wherein said first and second voltages turn on said string-select and said ground-select transistors, respectively.

3. The method of claim 1, wherein said erase verify voltage is approximately 0 volts.

4. The method of claim 1, wherein said bias voltage is positive.

5. The method of claim 1, wherein said NAND string is properly erased when the sensing current is detected and not properly erased when the sensing current is not detected.

6. The method of claim 1, wherein the detecting detects whether the entire sensing current flows through the NAND string.

7. The method of claim 6, wherein said NAND string is properly erased when the entire sensing current is detected and not properly erased when the entire sensing current is not detected.

8. The method of claim 1, wherein said NAND string is properly erased when all the floating gate transistors have erased threshold voltages less than or equal to a desired erased threshold voltage.

9. The method of claim 8, wherein said desired erased threshold voltage is the erase verify voltage minus the bias voltage minus the amount of overdrive needed to sink the entire sensing current.

10. A method of minimizing overerase of a NAND string, said string comprising a plurality of floating gate transistors coupled between a string-select transistor and a ground-select transistor, said method comprising:

performing an erase operation on said NAND string;

performing an erase verify operation on said NAND string, said erase verify operation comprising:

applying a first voltage to the select gate of the string-select transistor;

applying a second voltage to the select gate of the ground-select transistor;

applying a sensing current to the drain of the string-select transistor;

applying a non-negative erase verify voltage to the control gate of the floating gate transistors;

applying a bias voltage to the source of the ground-select transistor; and detecting whether the sensing current flows through the NAND string; and if no current is detected, performing a series of erase operations followed by said erase verify operation until the sensing current is detected.

11. The method of claim 10, wherein said erase verify voltage is approximately 0 volts.

12. The method of claim 10, wherein said bias voltage is positive.

13. The method of claim 10, wherein said performing a series of erase operations followed by said erase verify operation is performed until the entire sensing current is detected.

14. The method of claim 10, wherein said NAND string is properly erased when all the floating gate transistors have erased threshold voltages less than or equal to a desired erased threshold voltage.

15. The method of claim 14, wherein said desired erased threshold voltage is the erase verify voltage minus the bias voltage minus the amount of overdrive needed to sink the entire sensing current.

* * * * *